United States Patent
Smith et al.

(10) Patent No.: US 6,850,878 B2
(45) Date of Patent: Feb. 1, 2005

(54) SYSTEM AND METHOD FOR DETERMINING THE REQUIRED DECOUPLING CAPACITORS FOR A POWER DISTRIBUTION SYSTEM USING AN IMPROVED CAPACITOR MODEL

(75) Inventors: Larry D. Smith, San Jose, CA (US); David Hockanson, Boulder Creek, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 819 days.

(21) Appl. No.: 09/841,912

(22) Filed: Apr. 24, 2001

(65) Prior Publication Data

US 2002/0169590 A1 Nov. 14, 2002

(51) Int. Cl.⁷ .......................... G06F 17/50; G06F 17/10
(52) U.S. Cl. ................... 703/18; 703/2; 700/30
(58) Field of Search ............... 703/2, 18; 700/30, 700/31; 702/60; 716/2, 5; 361/698, 306.3

(56) References Cited

U.S. PATENT DOCUMENTS

| | | | |
|---|---|---|---|
| 5,883,814 A | 3/1999 | Luk et al. .................. 716/2 |
| 6,252,760 B1 | 6/2001 | Sen ..................... 361/306.3 |
| 6,580,609 B2 * | 6/2003 | Pautsch .................. 361/698 |

OTHER PUBLICATIONS

Smith et al., L.D. Power Distribution System Design Methodology and Capacitor Selection for Modem CMOS Technology, IEEE Transactions on Advanced Packaging, vol. 22, No. 3, Aug. 1999, pp. 284–291.*

Na et al.,N. Modeling and Transient Simulation of Planes in Electronic Packages, IEEE Transactions on Advanced Packaging, vol. 23, No. 3, Aug. 2000, pp. 340–352.*

Mandhana, O.P. Design Oriented Analysis of Package Power Distribution System Considering Target Impedance for High Performance Microprocessors, Electrical Performance of Electronic Packaging, IEEE, Oct. 2001, pp. 273–276.*

Smith et al., L.D. A Transmission–Line Model for Ceramic Capacitors for CAD Tools Based on Measured Parameters, Electronic Components and Technology Conference, IEEE, May 2002, pp. 331–336.*

International search report application No. PCT/US02/12707 mailed Sep. 24, 2003.

(List continued on next page.)

*Primary Examiner*—Russell Fredjd
(74) *Attorney, Agent, or Firm*—Myertons Hood Kivlin Kowert & Goetzel, P.C.; B. Noël Kivlin

(57) ABSTRACT

A system and method for determining the required decoupling capacitors for a power distribution system using an improved capacitor model. In one embodiment, a method for determining the decoupling capacitors for a power distribution system includes creating a model of the power distribution system using circuit simulation software, such as SPICE. The power distribution system model includes a plurality of cells interconnected at predetermined nodes. The method then selects one or more decoupling capacitors for the power distribution system. The decoupling capacitors are represented in the power distribution system model by a capacitor model, which is a mathematical model of an electrical circuit. The electrical circuit upon which the capacitor model is based is a ladder circuit. Following the selecting of the decoupling capacitors, the power distribution system model is update based on the selections, and operation of the power distribution system is then simulated. During the simulation, transfer impedance values are determined for each of the nodes, and compared to target impedance. The method is then repeated until each of the transfer impedance values is at or below the target impedance.

40 Claims, 12 Drawing Sheets

OTHER PUBLICATIONS

"High Frequency Model for Power Electronics Capacitors", Siami, et al, *IEEE Transactions on Power Electronics*, Mar. 2001, IEEE, US, vol. 16, No. 2, pp. 157–166.

"A Study of the High Frequency Performance of Thin Film Capacitors for Electronic Packaging", Chen, et al, *IEEE Transactions on Advanced Packaging*, May 2000, IEEE, US, vol. 23, No. 2, pp. 293–302.

"A High Frequency Model Based on the Physical Structure of the Ceramic Multilayer Capacitor", de Vreede, et al, *IEEE Transactions on Microwave Theory and Techniques*, Jul. 1992, IEEE, US, vol. 40, No. 7, pp. 1584–1587.

"Distributed SPICE Circuit Model for Ceramic Capacitors", Smith, et al, *2001 Proceedings, 51$^{st}$ Electronic Components and Technology Conference 2001*, Orlando, FL, May 29–Jun. 1, 2001, pp. 523–528.

"High–end Digital Systems Give a Thumbs Down to Rules of Thumb", Green, *EDN*, Jun. 5, 2000.

Hubing, "Power Bus Decoupling on Multilayer Printed Circuit Boards," May 1995, pp. 155–166.

Chen et al., "On–Chip Decoupling Capacitor Optimization for High–Performance VLSI Design," May 1995, pp. 99–103.

Drewniak, "Modeling Power Bus Decoupling on Multilayer Printed Circuit Boards," Aug. 1994, pp. 456–461.

* cited by examiner

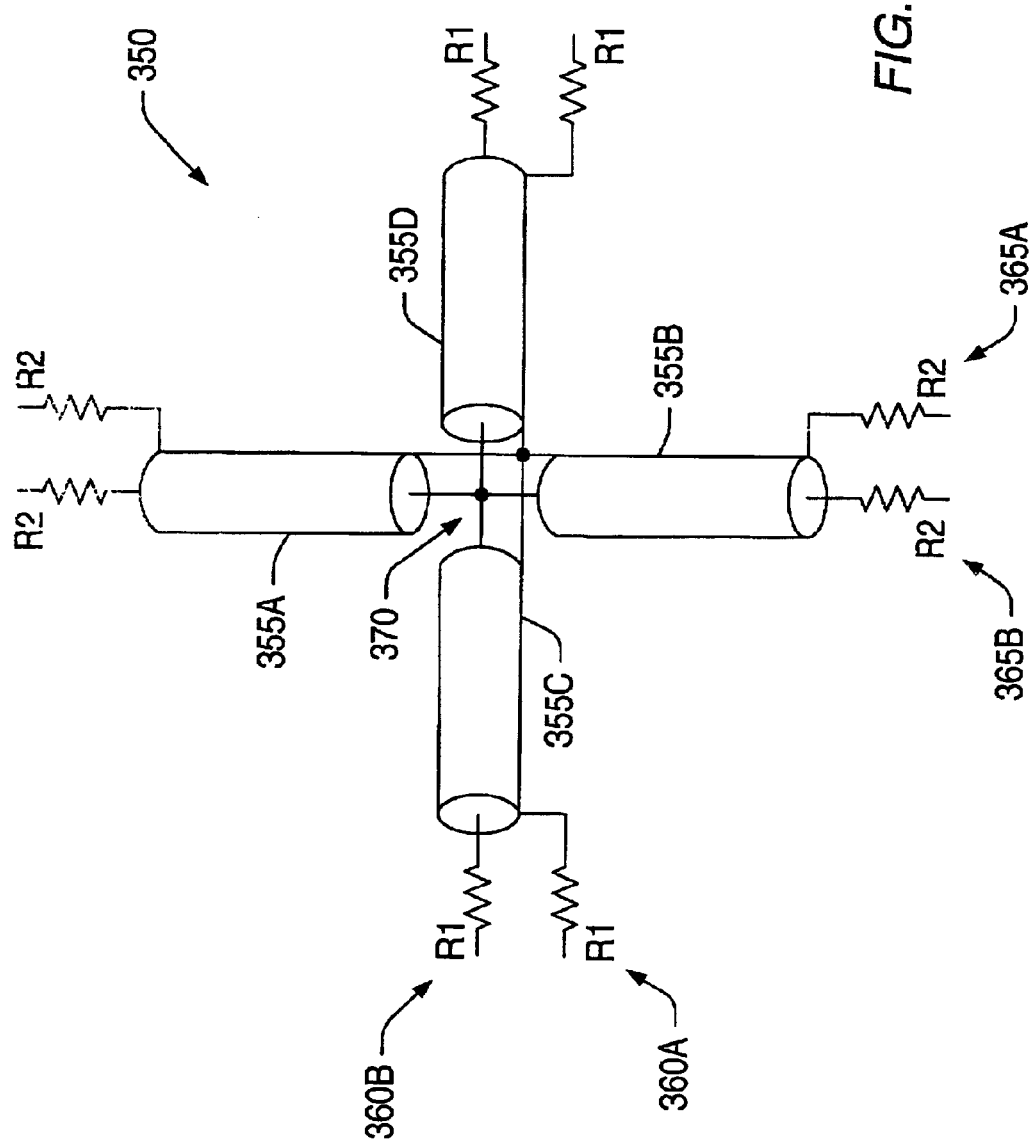

SYSTEM AND METHOD FOR DETERMINING THE REQUIRED DECOUPLING CAPACITORS FOR A POWER DISTRIBUTION SYSTEM USING AN IMPROVED CAPACITOR MODEL

BACKGROUND OF THE INVENTION

1. Field of the Invention

This invention relates to electronic circuits, and more particularly, the design of power distribution systems.

2. Description of the Related Art

As computer systems advance, there is a continuous demand for systems which demand higher power at a relatively low voltage. Designing power distribution systems that can deliver a large amount of current at a low voltage is a significant challenge. Tight voltage tolerances (e.g. ±5%) are often times required to ensure the proper performance of silicon chips within a computer system. The lower operating voltages may result in much lower target impedance requirements. At the same time, the clock frequencies for microprocessors and other types of silicon chips is continually increasing, thereby resulting in a much wider frequency range for which target impedance requirements must be met.

Power distributions systems typically include at least one pair of planar conductors (e.g. a power plane and a ground plane), separated by a dielectric layer. A plurality of capacitors may be electrically connected in a parallel configuration between the planar conductors in order to provide a low impedance path for power distribution. Many power distribution system employ a plurality of ceramic capacitors mounted upon a printed circuit board (PCB). Such capacitors may be chosen based on their ability to meet target impedance requirements for a given frequency, and capacitors having different values may be chosen to meet the target impedance requirements over a wider frequency range.

Electrical characteristics of capacitors which must be considered when designing power distribution systems include capacitance, equivalent series resistance (ESR) and equivalent series inductance (ESL). These characteristics have a significant effect on the electrical response of a given capacitor over a frequency range. At lower frequencies, the impedance provided by a capacitor is dominated by its capacitance. Since capacitors include conductive elements, such as conductive plates and mounting pads or pins, there is an inductance (ESL) associated with them. This inductance dominates the impedance profile of a capacitor at higher frequencies. The point at which the inductive and capacitive reactances cancel each other out is known as the resonant frequency, and the impedance provided by the capacitor at this frequency is known as the ESR.

FIG. 1 illustrates the frequency response for a typical capacitor. At lower frequencies, the impedance decreases with frequency at a rate of approximated −20 dB/decade. At these frequencies, the impedance provided by the capacitor is dominated by capacitance, and may be calculated by the formula $$Z = \frac{1}{j\omega C},$$

where Z is the impedance, C is the capacitance, and $\omega$ is the angular frequency. As frequency increases, the capacitor will eventually achieve a state of resonance, as the capacitive reactance will be offset by the inductive reactance. This resonant frequency may be calculated by the formula $$F = \frac{1}{2\pi\sqrt{LC}},$$

where F is the resonant frequency, L is the equivalent series inductance, and C is the capacitance. The impedance provided by a capacitor at its resonant frequency is the capacitor's ESR. At frequencies above the resonant frequency, the impedance provided by a capacitor may be dominated by its ESL. The impedance of the capacitor for frequencies greater than the resonant frequency may be calculated by the formula $$Z = j\omega L,$$

where Z is the impedance, L is the ESL, and $\omega$ is the angular frequency. In designing power distribution systems, a plurality of capacitors having different impedance profiles may be combined in order to achieve a target impedance over a wide frequency range.

Designing power distribution systems and determining the necessary decoupling capacitors often times includes modeling and simulation. The power distribution system, as well as the various circuitry to which power is to be provided, may be modeled and simulated so as to predict the performance of the power distribution system. FIG. 2 is a schematic of one embodiment of a traditional electrical model for a capacitor. The embodiment shown is a model of a capacitor based on a series RLC circuit. The model includes a resistor representing the capacitor's ESR value, a capacitor representing its capacitance value, and an inductor representing its ESL value. The model may be implemented as a SPICE model or other type of mathematical for simulation on a computer system.

The capacitor model of FIG. 2 may be useful for simulation at lower frequencies, but may be inadequate for higher frequencies. As previously stated, power distribution systems typically include a pair of planar conductors separated by a dielectric, which may act as a capacitor at lower frequencies. At higher frequencies, a pair of planar conductors may develop impedance resonances that are associated with the parallel plate geometry. These impedance peaks are sometimes referred to as anti-resonances, or parallel resonances. The traditional series RLC circuit model of a capacitor may be unable to correctly predict the frequency or frequencies at which anti-resonances occur.

FIG. 3 is a graph illustrating the simulated and measured performance of a capacitor mounted between two power planes over a range of frequencies, wherein the simulation is based on the traditional model of FIG. 2. Both the simulated and measured results were for a pair of conductive planes (i.e. a power plane and ground plane) having a single capacitor mounted electrically connected between the planes. The capacitor model used for the simulated results was the traditional RLC series circuit model. As can be seen from examining the graph, model-to-hardware correlation is good for the lower frequencies. However, the simulated results differ from the measured results significantly with respect to both the frequency and magnitude of the first anti-resonant peak. In this particular example, the simulated results predict an anti-resonant peak at a lower frequency and of significantly higher magnitude than that obtained by the measured results. Second and third anti-resonant peaks also differ between simulated and measured results. The second anti-resonant peak from the measured results occurs at a frequency close to that which is predicted by the simulated results. The third anti-resonant peak for the measured results occurs at a higher frequency and lower magnitude than predicted by the simulated results.

The higher operating speeds of the various silicon chips in computer systems (or other electronic systems) often times results in the need for higher clock frequencies on system boards. Accurate modeling is important in designing power distribution systems for these systems. As such, the traditional RLC series circuit model for capacitors is no longer adequate for determining the necessary decoupling capacitors for a power distribution system.

SUMMARY OF THE INVENTION

The problems outlined above are in large part solved by a system and method for determining the required decoupling capacitors for a power distribution system using an improved capacitor model. In one embodiment, a method for determining the decoupling capacitors for a power distribution system includes creating a model of the power distribution system using circuit simulation software, such as SPICE. The power distribution system model includes a plurality of cells interconnected at predetermined nodes. The method then selects one or more decoupling capacitors for the power distribution system. The decoupling capacitors are represented in the power distribution system model by a capacitor model, which is a mathematical model of an electrical circuit. The electrical circuit upon which the capacitor model is based is a ladder circuit. The "rails" of the ladder include a plurality of inductors coupled in a series configuration, and thus the circuit includes a first rail circuit and a second rail circuit. Each "rung" of the ladder comprises a circuit having a resistor and a capacitor which are connected in a series configuration. Each rung circuit is arranged to electrically connect the first rail circuit and the second rail circuit at distinct nodes, thereby forming a "ladder" configuration. Following the selecting of the decoupling capacitors, the power distribution system model is updated based on the selections, and operation of the power distribution system is then simulated. During the simulation, transfer impedance values are determined for each of the nodes, and compared to target impedance. The method may then be repeated until each of the transfer impedance values is at or below the target impedance.

In one embodiment, the rail circuits of the capacitor model represent posts of a capacitor, such as a ceramic capacitor, which are used for mounting and electrically connecting (e.g. soldering) the capacitor to a printed circuit board. Each inductor in the rail circuits represents a portion of the equivalent series inductance (ESL) provided by the capacitor. The rail circuit may also factor in inductance provided by pads to which a capacitor represented by the model may be mounted. The rung circuits each represent two electrical characteristics of the capacitor. The capacitors of each rung circuit represent a portion of the capacitance provided by the capacitor. In one embodiment, a capacitor represented by the model includes a plurality of conductive plates connected to a first post and a plurality of conductive plates connected to a second post, with a dielectric arranged between the plates, thereby providing capacitance. The resistor of each rung circuit represents a portion of the equivalent series resistance (ESR) provided by the capacitor, which is the impedance of the capacitor at its resonant frequency.

The plurality of cells in the power distribution system model may each represent electrical characteristics of the power distribution system, including characteristics of a printed circuit board. The electrical characteristics represented by each cell may include characteristics corresponding to one or more transmission lines and one or more resistors. The transmission lines may be characterized by at least one impedance value and at least one time delay, and may correspond to the physical dimensions of the power distribution system (e.g. the dimensions of a printed circuit board). The power distribution system may also have a power supply, which may be represented in the power distribution system model. The power supply may be characterized by one or more pole frequencies, one or more zero frequencies, and one or more resistances.

Thus, in various embodiments, the system and method described herein may allow for improved designs of power distribution systems. Use of the improved capacitor model based on a ladder circuit may allow for more accurate prediction of anti-resonant peaks that may occur at various frequencies during operation of the power distribution system. Accurate prediction of both the frequency and magnitude of the anti-resonant peaks may make these peaks easier to manage in power distribution system designs, and may further help minimize the actual quantity of capacitors necessary to meet target impedance requirements throughout the frequency range of interest.

BRIEF DESCRIPTION OF THE DRAWINGS

Other objects and advantages of the invention will become apparent upon reading the following detailed description and upon reference to the accompanying drawings in which:

FIG. 4B is an embodiment of a unit cell of the power distribution system model shown in FIG. 4A;

Figure 1:
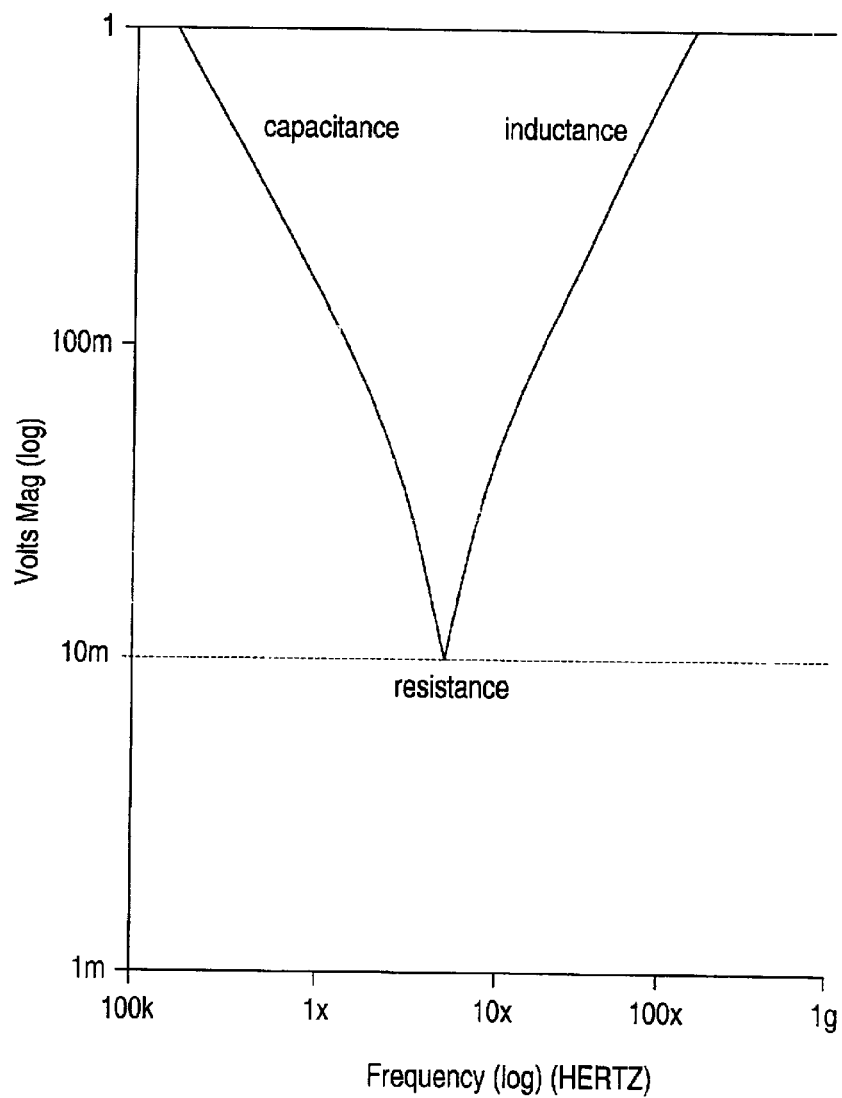
FIG. 1 (prior art) is a graph illustrating the frequency response of a single capacitor over a range of frequencies.
Figure 2:
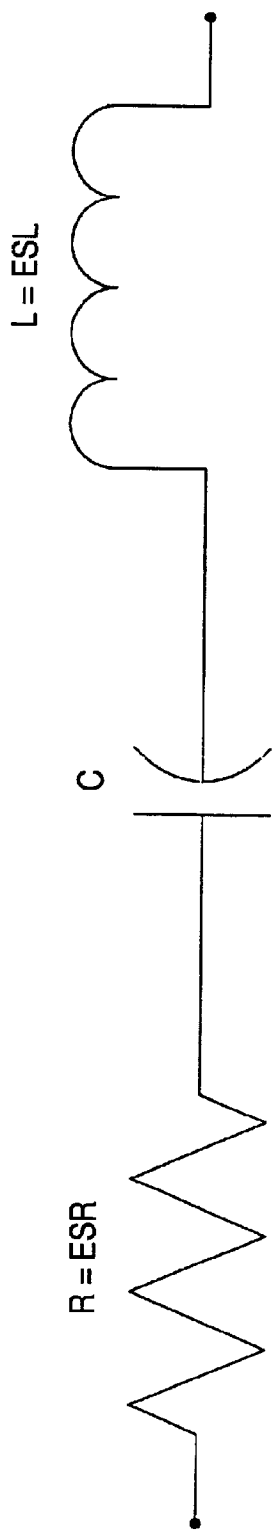
FIG. 2 (prior art) is a schematic of one embodiment of a traditional electrical model for a capacitor.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

FIG. 4—Power Distribution System Model

Figure 4A:
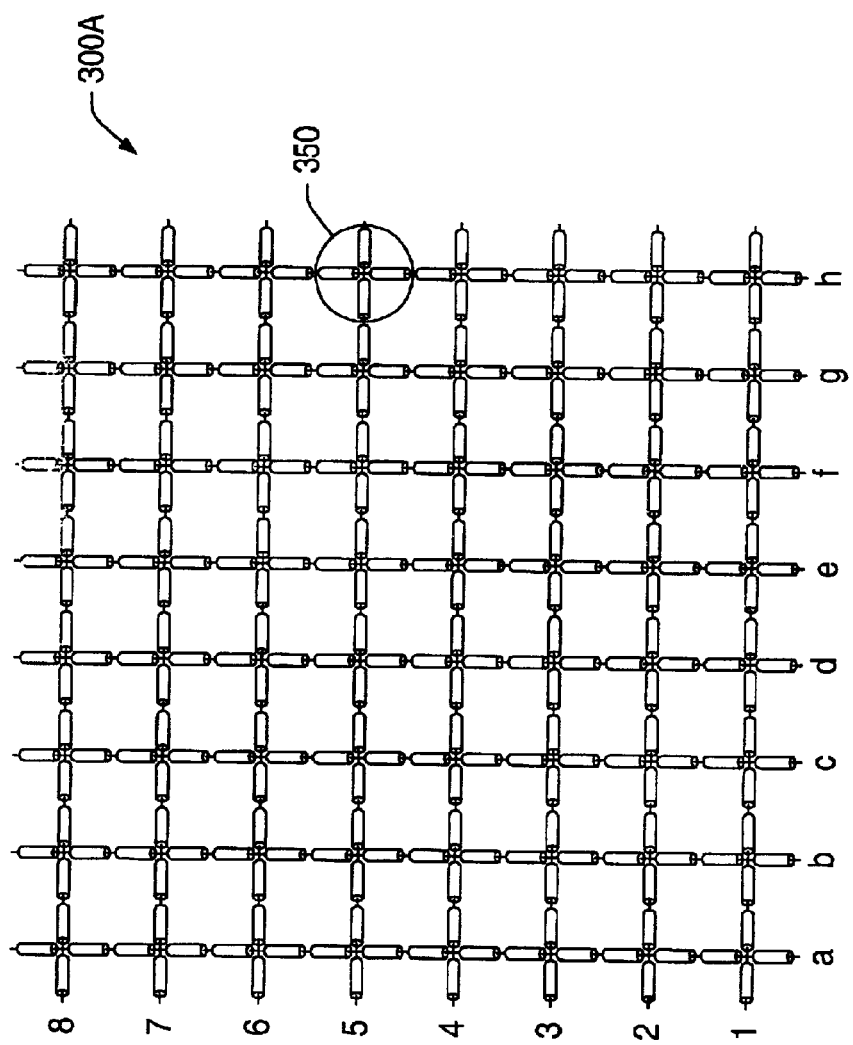
FIG. 4A is a top view of one embodiment of a model of a power distribution system.

FIG. 4A is a top view of a simplified schematic of one embodiment of a model of a power distribution system for an electronic circuit. As shown, the model comprises a grid 300A of transmission line segments. The segments are grouped into unit cells 350. As shown, there are eight columns labeled "a" through "h", as well as eight rows labeled, from the bottom to the top, "1" through "8". The model preferably comprises a SPICE array of transmission lines in a fixed topology (i.e. in an 8×8 grid). The transmission lines may be of variable lengths such that the fixed topology may be used on electrical connecting device of any physical dimensions. It is noted that other embodiments of the power distribution system are contemplated, such as an elliptical model based on a "wheel and spoke" geometry. The model may be implemented using circuit simulation software on a computer system. In one embodiment, the model may be a SPICE model, although models using other types of circuit simulation software are possible and contemplated.

FIG. 4B illustrates a close up view of the unit cell 350 from FIG. 4A. As shown, the unit cell 350 may be comprised of four transmission lines 355A–355D. The four transmission lines 355 connect together at nodal point pair 370, also referred to as node 370. As shown, connections to the center conductors represent plane 1, while connections to shield are plane 2. Note that the model is balanced, therefore either plane 1 or plane 2 may be power or ground, as desired. Transmission lines 355A and 355B are preferably described with a width impedance "$Z_w$" and a width time delay "$t_{DW}$". Transmission lines 355C and 355D are preferably described with a length impedance "$Z_L$" and a length time delay "$t_{DL}$". $R_1$ and $R_2$ are resistances. The constants, parameters and variables of interest, as well as the equations that define and relate these quantities, along with the preferred units are given below:

"L" is the length of the plane (inches)

"W" is the width of the plane (inches)

"thk" is the thickness of the dielectric (mils)

"cu" is the metalization thickness (mils)

"velc" is the speed of light in a vacuum (inches/sec)

"hertz" is the frequency variable

"$\epsilon_0$" is the vacuum dielectric constant (permittivity) (picofarads/inch)

"$\epsilon_r$" is the dielectric constant

"σ" is the copper conductivity (per ohm/mils)

"$\mu_0$" is the permeability of a vacuum (henries/mil)

"vel" is the velocity of a signal on the electrical interconnecting apparatus $$\text{vel}=\text{velc}/\sqrt{\epsilon_r}$$

"n" is the size of the grid, i.e. 8 as shown

"asp" is the aspect ratio of the grid, asp=L/W

"factor" is a calibration factor to compensate for capacitive loading $$\text{factor}=1/\sqrt{2}$$

"$t_{FL}$" is the time of flight for the length dimension, $t_{FL}=L/\text{vel}$ "$t_{FW}$" is the time of flight for the width dimension, $t_{FW}=W/\text{vel}$ "$t_{DL}$" is the transmission line delay time for the length dimension $$t_{DL}=t_{FL}/(2n)\text{factor}$$

$$t_{DW}=t_{FW}/(2n)\text{factor}$$

"$t_{DW}$" is the transmission line delay time for the width dimension

"cap" is the parallel plate capacitance of the plane $$cap=(\epsilon_0\epsilon_r LW)/(10^{-9}thk)$$

"$Z_L$" is the impedance in the length direction $$Z_L=(n/\text{cap})(t_{FL}+asp*t_{FW})\text{factor}$$

"$Z_w$" is the impedance in the width direction, $Z_w=Z_L/asp$

"$R_1$" is the smaller of:

$$R_{1A}=((L/W)/2)*(1/(\sigma*(1/\sqrt{\text{hertz}*\pi\mu_0\sigma})))$$

$$R_{1B}=((L/W)/2)*(1/(\sigma*cu))$$

"$R_2$" is the smaller of:

$$R_{2A}=((W/L)/2)*(1(\sigma*(1/\sqrt{\text{hertz}*\pi\mu_0\sigma})))$$

$$R_{2B}=((W/L)/2)*(1/(\sigma*cu))$$

The model represents an electrical interconnecting apparatus, which may be, for example, a printed circuit board (PCB), a semiconductor device package substrate, or an integrated circuit substrate. The method may include creating a model of the power distribution system based upon an M×N grid for both the power plane and the ground plane. The model may be based upon a fixed grid that adapts automatically to the actual physical dimensions of the electrical interconnecting apparatus. The model may also calculate the system response to chosen decoupling capacitors in both single node and M×N node versions.

The model may receive input from a user and/or from a database of various physical and/or electrical characteristics for a plurality of decoupling capacitors. Various characteristics of interest include physical dimensions, type and thickness of dielectric, method and materials of manufacture, capacitance, mounted inductance, and equivalent series resistance (ESR). The desired characteristics are may be saved in a database for corrections, additions, deletions, and updates. The model of the power distribution system may be updated based on the selection of decoupling capacitors. The capacitors themselves may be modeled as "ladder" circuit, which will be explained in further detail below.

In one embodiment, the model of the power distribution system may be in a form representing a plane having two dimensional distributed transmission lines. The model of the power distribution system may comprise a plurality of the following: one or more physical dimensions of the power plane, one or more physical dimensions of the ground plane, physical separation distance of the power plane and the ground plane, composition of a dielectric separating the power plane and the ground plane, one or more active device characteristics, one or more power supply characteristics, and one or more of the decoupling capacitors. In a one embodiment, M and N have an equal value, 8 as shown in this particular example. In various embodiments, the active components may act as current sources and/or sinks, and may include processors, memories, application specific integrated circuits (ASICs), or logic ICs. In one embodiment, a total sum of all values of the current sources in the model may be scaled to equal one ampere.

The power distribution system may include a power supply, and thus the power distribution system model may include attributes of the power supply. The power supply attributes may include a voltage, voltage ripple, and maximum current. Further attributes of the power supply which may be included in the model may be one or more pole frequencies, one or more zero frequencies, and one or more resistances, such as output resistances of the power supply.

In one embodiment, the method for determining the required decoupling capacitors of the power distribution system may comprise determining the decoupling capacitors for a frequency range of interest. The frequency range of interest may be determined based on various factors, such as frequency of operation of various IC's which receive power from the power distribution system, clock frequencies and associated frequency content of the clock edge rates, harmonic frequencies and so on. In one embodiment, the target impedance may be constant over the frequency range of interest, while in another embodiment, the target impedance may be a continuous function of frequency, and thus may vary over the frequency range of interest.

In various embodiments, the method may use a weighting factor in determining a quantity of a particular decoupling capacitor to include in the model. The weighting factor is a dimensionless non-zero positive number. In the frequency range where EMI is most important, the preferred weighting factor is 0.2. The EMI frequency range is preferably above approximately 200 MHz. Preferably, the weighting factor is 1.0 in a frequency range where signal integrity is most important. The frequency range where signal integrity is important may be approximately 10 MHz up to approximately 200–300 MHz. The weighting factor is preferably 2.0 at all active device operating frequencies and harmonics of the active device operating frequencies. In one embodiment, the model may account for the affects of frequency dependent skin effect loss.

FIG. 5—Grid

Figure 5:
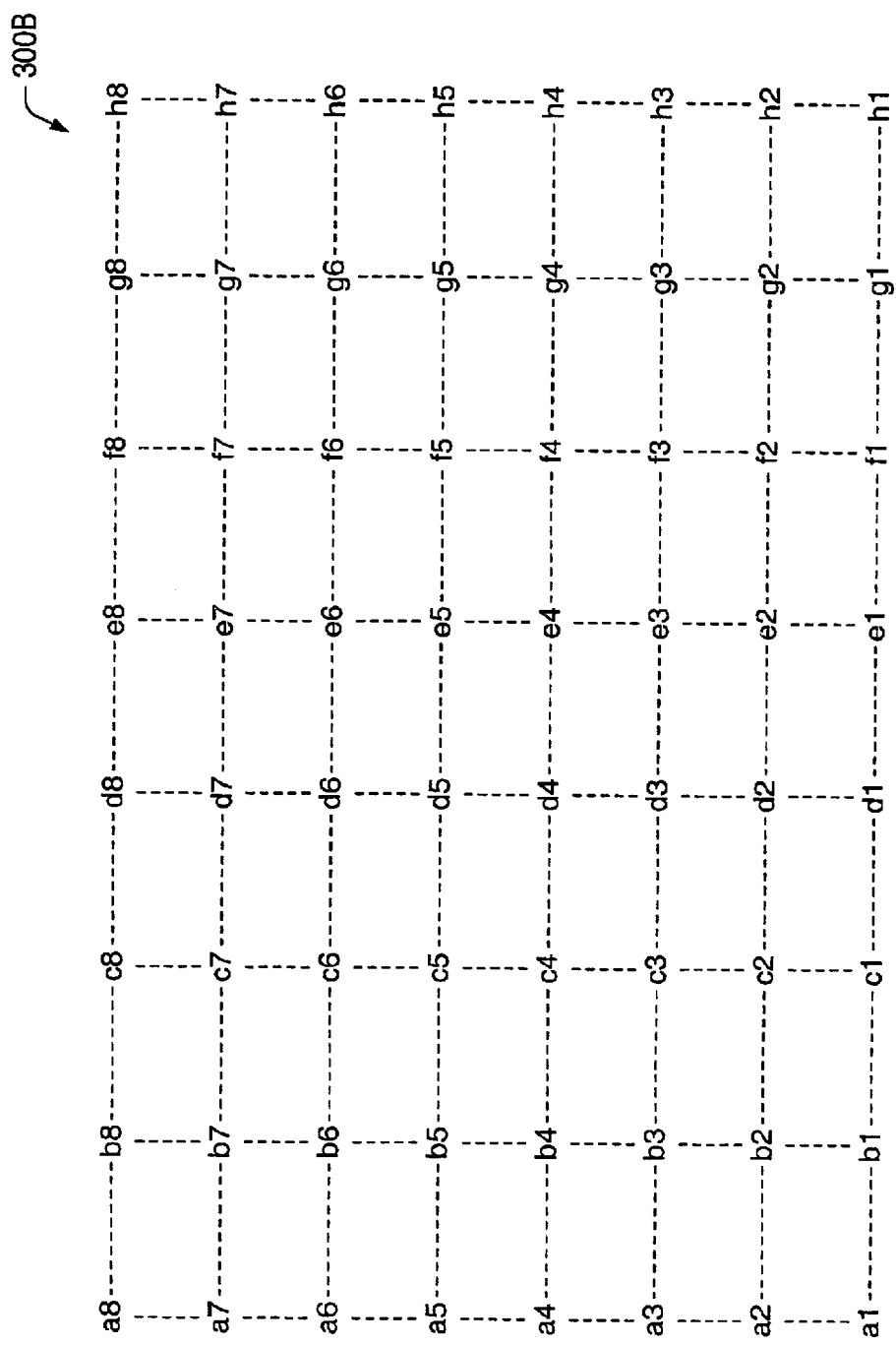
FIG. 5 is a representative grid of the nodal interconnections of the model of the power distribution system shown in FIG. 4A

FIG. 5 illustrates the 8×8 grid 300B of nodes 370 that are used to model the power and ground planes with the respective designations of a1 through h8, in one embodiment. This grid 300B may be used to determine the locations of the decoupling capacitors for the power distribution system.

Figure 6:
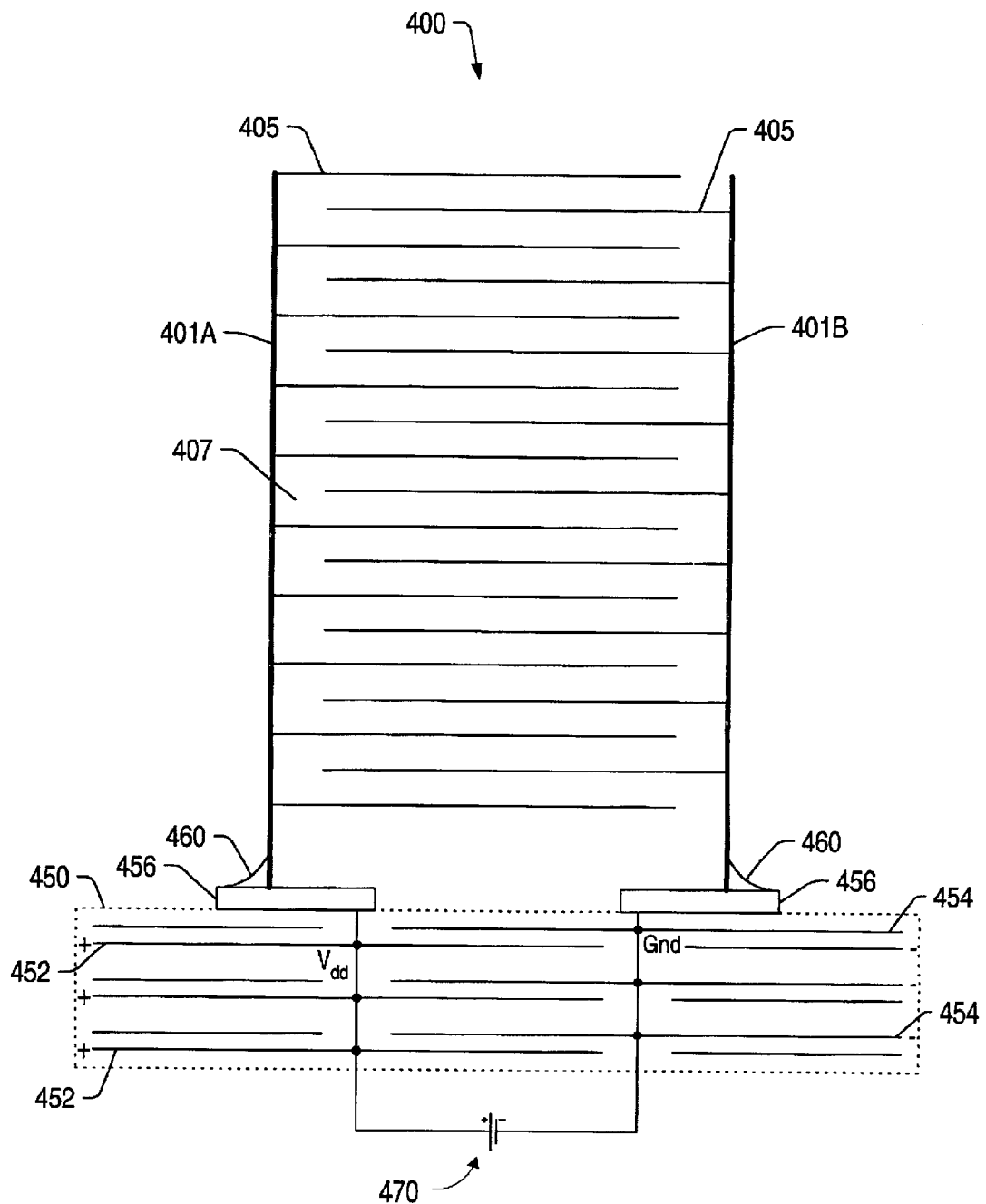
FIG. 6 is a cross section of one embodiment of a discrete capacitor mounted on a PCB having a plurality of power plane pairs.

FIG. 6—Cross Section of a Discrete Capacitor

FIG. 6 is a cross section of one embodiment of a discrete capacitor mounted on a PCB having a plurality of power plane pairs. Capacitor 400 includes a first post 401A and a second post 401B, each made of a conductive material. Solder fillets 460 are used to physically and electrically couple capacitor 400 to mounting pads 456 of printed circuit board (PCB) 450. PCB 450 includes a plurality of power planes 452 and ground planes 454. First post 401A of capacitor 400 is electrically coupled to power planes 452 while second post 401B of is electrically coupled to ground planes 454. Power planes 452 and ground planes 454 of PCB 450 may be coupled to a power supply 470. In some embodiments, power supply 470 may be part of a printed circuit assembly of which PCB 450 is a part. In other embodiments, power supply 470 may be an external power supply that is connected to power plane 452 and ground plane 454 by a connecting means such as a cable and/or connector. Power supply 470 may also be a voltage regulator which is configured to receive a first voltage at a first current and output a second voltage at a second current. The first voltage may be received from a source on PCB 450, or from an external source.

Other embodiments of capacitor 400 are possible and contemplated. Such embodiments may include a different geometry, a greater or lesser number of capacitor plates, and a different means for physically and/or electrically coupling the capacitor to a carrier, such as a printed circuit board.

Capacitor 400 includes a plurality of conductive plates 405. Approximately half of the conductive plates 405 may be electrically connected to first post 401A, with the remaining conductive plates 405 electrically connected to second post 401B. Dielectric material 407 may be arranged between conductive plates 405 and interspersed throughout capacitor 400. Conductive plates 405 may provide a majority of the ESR of capacitor 400, although posts 401A and 401B may make contributions to the ESR as well. Dielectric 407 contributes little, if any, to the ESR of capacitor 400 at frequencies below 1 GHz.

Current may travel around a loop and through capacitor 400. The current path around the loop may start on the power plane 452, through mounting pad 456 and solder fillet 460 and into first post 401A. After current enters first post 401A, it may continue up through the post or may distribute itself laterally into one of plates 405. Since electrical current follows the path of least resistance, the current will distribute itself accordingly. Eventually, all current paths will lead into the capacitor plates 405 which are connected to first post 401A, where the conduction current will become a displacement current as it travels through dielectric 407. The displacement current may then revert back to a conduction current as it distributes itself onto the capacitor plates 405 that are connected to second post 401B. The current may then travel through second post 401B, solder fillet 460 and mounting pad 456, and into ground plane 454.

All conductive materials include a certain amount of inductance. Recall that the impedance of an inductor (or any conductor having inductance) may be defined by the formula Z=jωL. From the formula it can be seen that the impedance of an inductor increases proportionally as frequency increases. Thus, as frequency increases, the current entering first post 401A may encounter greater impedance as it travels higher into the post. Since current takes the path of least resistance (or impedance), current at higher frequencies will tend to distribute itself onto the lower conductive plates 405 rather than traveling through the length of first post 401A before distributing itself onto a conductive plate 405. Thus, at high frequencies, the current traveling though capacitor 400 may make a smaller loop than at lower frequencies. This phenomenon, combined with the physical construction of the capacitor may be used to form the basis for an improved capacitor model which may be used in the various embodiments of the system and method for determining the decoupling capacitors for a power distribution system.

Figure 7:
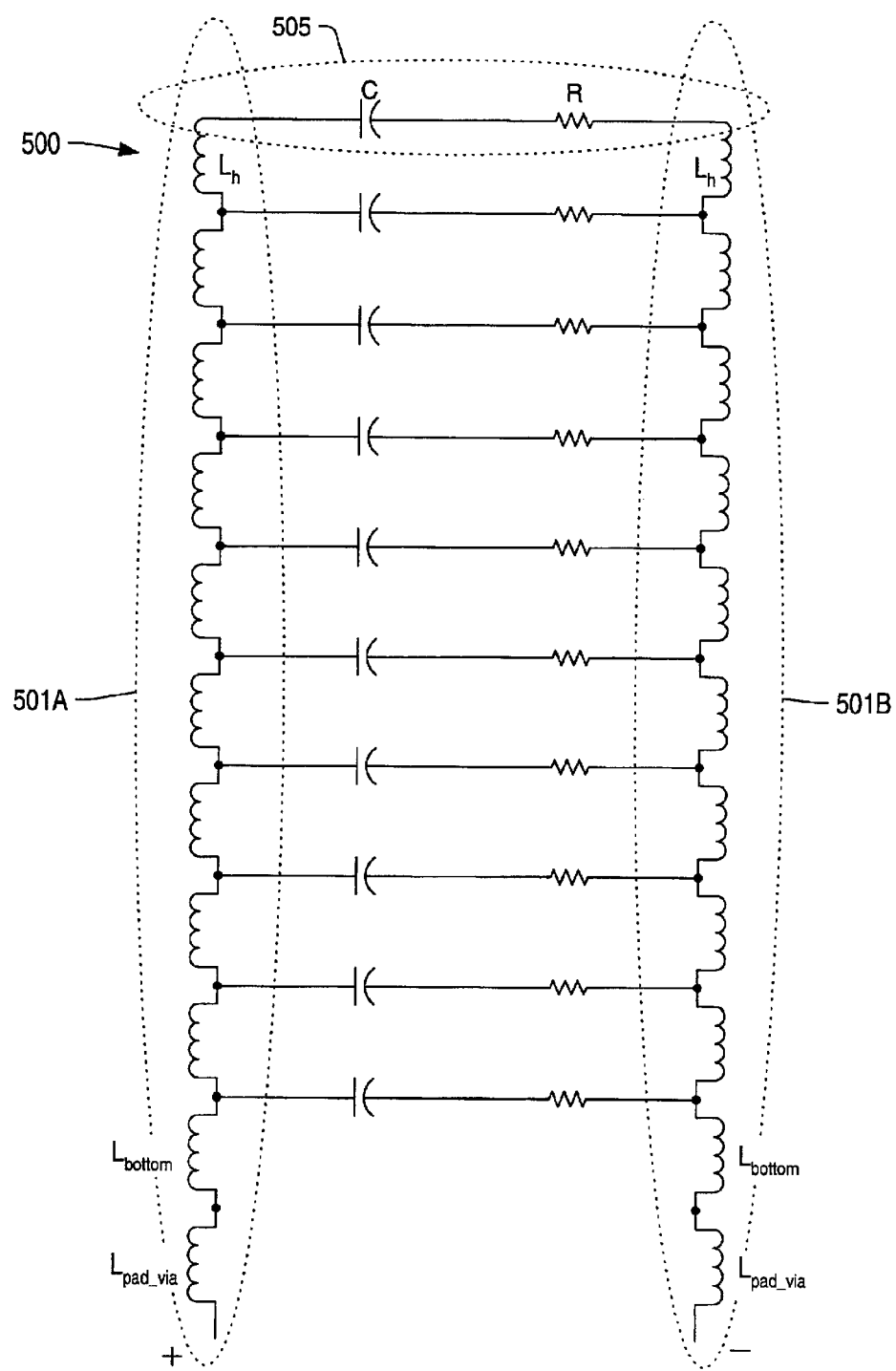
FIG. 7 is a schematic diagram of one embodiment of a distributed model of a discrete capacitor, such as that of FIG. 6.

FIG. 7—Distributed Model of a Discrete Capacitor

Moving now to FIG. 7, a schematic diagram of one embodiment of a distributed model of a discrete capacitor is shown. Ladder circuit 500 may be used as a basis of a model for representing a capacitor, such as capacitor 400 of FIG. 6. The traditional series RLC circuit model of a capacitor models the parameters of a given capacitor as lumped parameters. In contrast, ladder circuit 500 uses distributed parameters to model a capacitor. In one embodiment, the model may be implemented in circuit simulation software (e.g. the model may be a SPICE model in one embodiment). In the embodiment shown, ladder circuit 500 includes "rail" circuits 501A and 501B, and a plurality of "rung" circuits 505. The terminology used herein to describe ladder circuit 500 is used in order to simplify the explanation of the arrangement of the various circuit elements present in the circuit model. The schematic of ladder circuit 500 reveals an arrangement of circuit elements resembling a ladder having a pair of rails and a plurality of rungs.

Rail circuits 501A and 501B each comprise a plurality of inductors arranged in a series configuration. Each of the inductors of rail circuits 501A and 501B represent a portion of the total equivalent series inductance (ESL) of the capacitor which is modeled by ladder circuit 500. Rail circuits 501A and 501B are electrically coupled to each other by rung circuits 505, each of which includes a resistor and a capacitor. Each resistor present in ladder circuit 500 represents a portion of the total equivalent series resistance (ESR) of the capacitor modeled by ladder circuit 500. Similarly, each of the capacitors present in ladder circuit 500 represent a portion of the total capacitance provided by the capacitor that is modeled by ladder circuit 500. The actual number of rung circuits 505, as well as the number of inductors in rail circuits 501A and 501B, may be adjusted for various embodiments to correspond with the construction of the capacitor that is to be modeled. Physical dimensions and the actual number of plates present of the capacitor to be modeled may be important factors to be considered when modeling a particular capacitor.

As previously stated, rail circuits 501A and 501B are electrically connected to each other by a plurality of rung circuits 505. Each rung circuit 505 provides an electrical connection between the rail circuits at distinct nodes as shown in the schematic. At the bottom of rail circuits 501A and 501B are inductors $L_{bottom}$ and $L_{pad\_via}$. The inductors $L_{bottom}$ of each rail simulate the inductance provided by the bottom of the posts (such as posts 401A and 401B of FIG. 6), while the inductors $L_{pad\_via}$ simulate the inductance provides by the mounting pads and solder connections.

During simulation of a capacitor modeled by ladder circuit 500, current will distribute itself according to a path of least impedance. As previously noted, the reactance of an inductor (and thus its impedance) is directly proportional to frequency, while the reactance of a capacitor is inversely proportional to frequency. At lower frequencies, the inductors represent a small reactance, while the capacitors represent a large reactance. Thus, at low frequencies, current traveling into capacitor 400 of FIG. 7 may tend to distribute itself relatively evenly among the conductive plates 405. Similarly, at low frequencies, current in ladder circuit 500 may tend to distribute itself relatively evenly among the rung circuits 505.

As frequency increases, the impedance provided by the inductance present in capacitor 400 increases proportionally. With the larger current loops associated with the higher conductive plates 405, more magnetic flux is stored, and thus a larger inductance (and therefore impedance) is created. Similarly, in ladder circuit 500, at higher frequencies, greater impedances are associated with rung circuits 505 that are higher on the ladder. This is because current traveling through the higher rung circuits 505 encounter more inductors, and therefore more inductive reactance, than those rung circuits closer to the bottom of the ladder. Thus, as frequency increases, the current through ladder circuit 500 tends to distribute itself along the lower rung circuits 505. The tendency of current to stay low in the smaller loops in capacitor 400 (and as simulated using the capacitor model based on ladder circuit 500) may have profound effects on the magnitude and frequency of the parallel anti-resonances produced when the capacitor is mounted upon a PCB. This will be explained in further detail with respect to FIGS. 8A, 8B, and 8C.

Figure 8A:
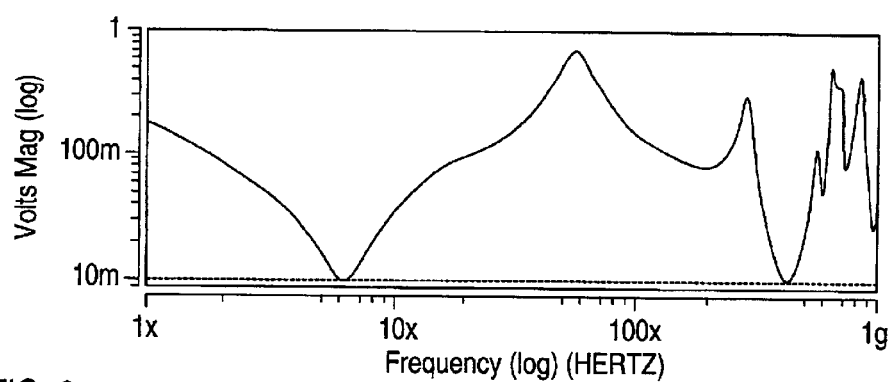
FIG. 8A is a graph illustrating the results of a board impedance simulation for a single capacitor, represented by one embodiment of the capacitor model, mounted to a printed circuit board.
Figure 8B:
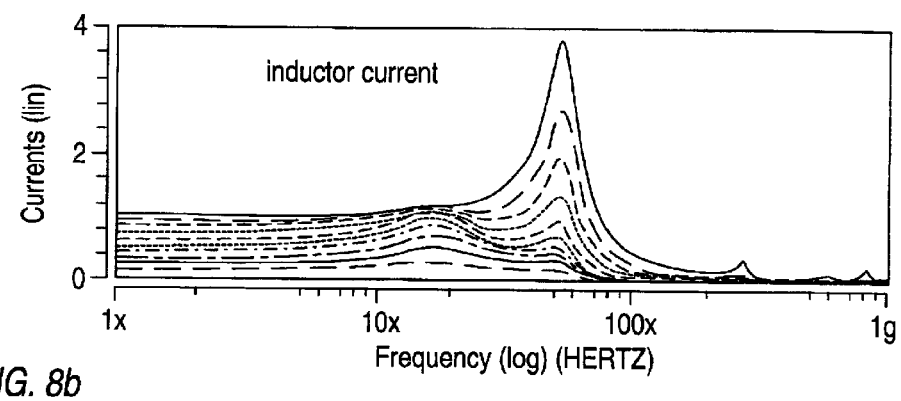
FIG. 8B is a graph illustrating the internal inductor currents for a simulation using one embodiment of the capacitor model.
Figure 8C:
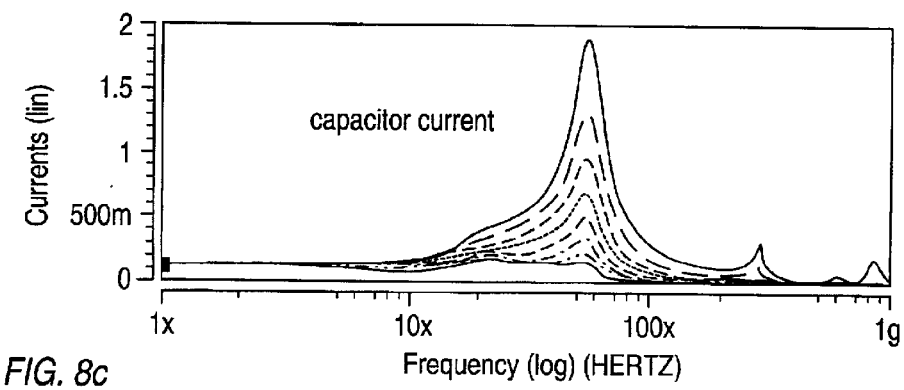
FIG. 8C is a graph illustrating the internal capacitor currents for a simulation using one embodiment of the capacitor model.

FIGS. 8A, 8B, and 8C—Simulated Impedance and Internal Capacitor Currents

FIG. 8A is a graph illustrating the results of a board impedance simulation for a single capacitor, represented by one embodiment of the capacitor model, mounted to a printed circuit board. It should be noted here that the impedance is actually expressed as voltage magnitude. As shown herein, the graph of FIG. 8A illustrates the impedance characteristics over a wide frequency range. At the lower and middle frequencies, the simulation shows the circuit to have an impedance profile that is typical for a capacitor. At the low end of the frequency spectrum, the impedance is dominated by capacitive reactance, and decreases as frequency increases. As the frequency increases, the capacitor eventually reaches a state of resonance, at which the capacitive and inductive reactances cancel each other out. At this frequency, the impedance of the capacitor is its ESR, and may be purely resistive in nature. For frequencies above the resonant frequency, impedance is dominated by the inductive reactance, and increases proportionally with the frequency until reaching the first anti-resonant peak. This anti-resonant peak is a result of the dominance of inductive reactance of the circuit combined with the capacitance formed by the power and ground planes. Since the circuit is in a parallel configuration with respect to the power/ground plane combination (which in effect, forms a capacitor), a classic LC tank circuit having an impedance peak is formed. For frequencies above that at which the first anti-resonant peak occurs, several other peaks and valleys may be present as well, as shown in the graph.

FIG. 8B is a graph illustrating the internal inductor currents for a simulation using one embodiment of the capacitor model. The graph illustrates current vs. frequency for a plurality of the inductors of rail circuits 501A and 501B. Those inductors that are lower on rail circuits 501A and 501B have the highest current. The current is diminished for each successive inductor that is higher up one the rails.

With respect to frequency, the current through each of the inductors is relatively steady over the lower part of the frequency spectrum. As the frequency approaches the first parallel anti-resonant frequency, the current begins to increase, and peaks at a frequency that is approximately equal to the parallel anti-resonant frequency. For frequencies above the resonant frequency, the inductor currents tend to diminish rapidly.

FIG. 8C is a graph illustrating the internal capacitor currents for a simulation using one embodiment of the capacitor model. The graph illustrates current vs. frequency for a plurality of capacitors, wherein each of the capacitors is present on one of the rung circuits 505. At low frequencies, the current through each of the capacitors, is nearly identical for each of the capacitors. This is reflective of the current distribution of the actual capacitor that is modeled by ladder circuit 500. At low frequencies, when inductive reactance is at a minimum, current in the capacitor tends to distribute itself evenly along each of the plates in the capacitor. At the series resonant frequency, all capacitor plates are equally engaged with current. As the frequency increases towards the first parallel anti-resonant frequency, there is a sharp spike in the capacitor currents, with the capacitor of the lower rung circuits 505 carrying a majority of the current. Current then drops sharply for frequencies above the first parallel anti-resonant frequency.

Figure 3:
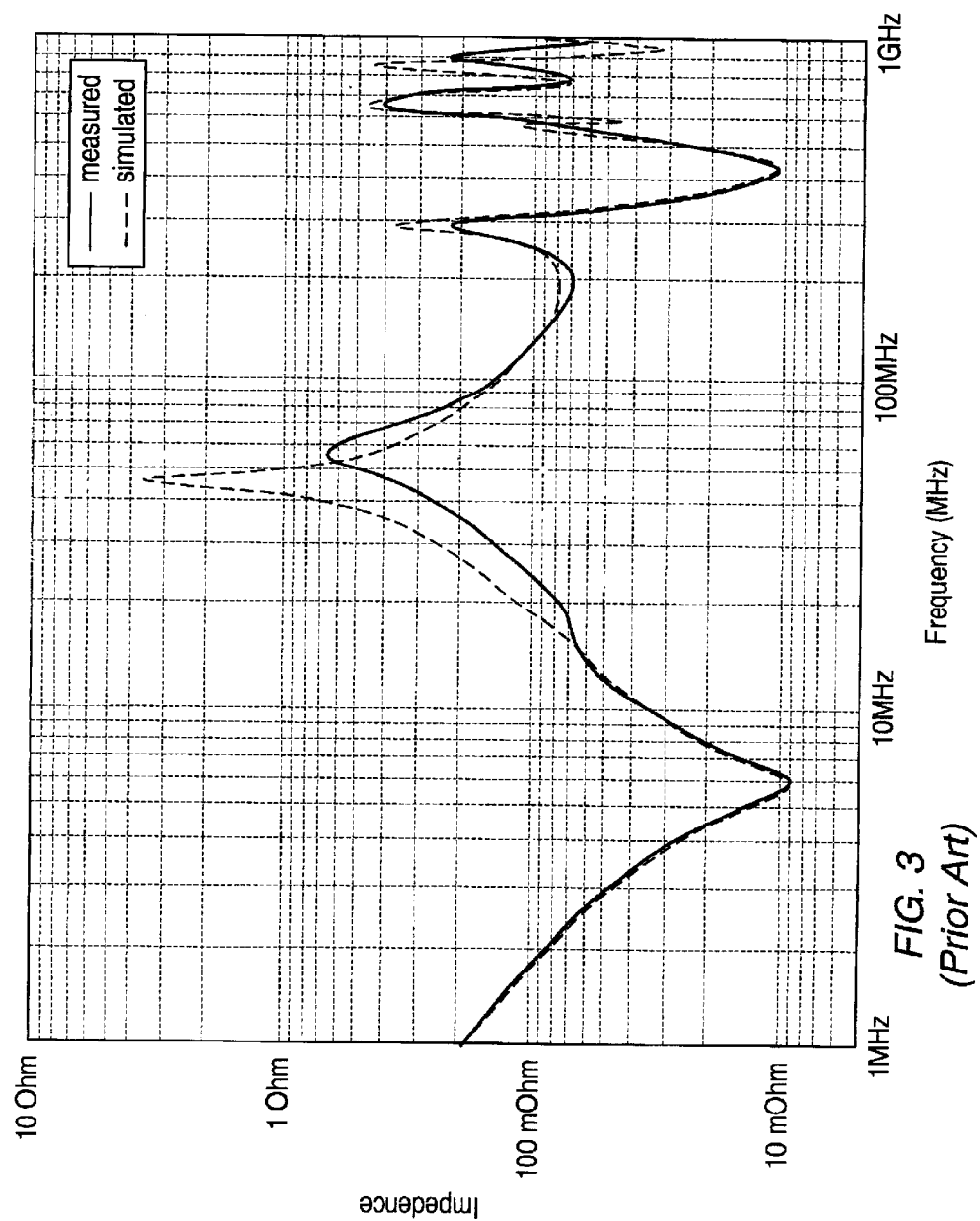
FIG. 3 (prior art) is a graph illustrating the simulated and measured performance of a capacitor mounted between two power planes over a range of frequencies, wherein the simulation is based on the traditional model of FIG. 2.
Figure 9:
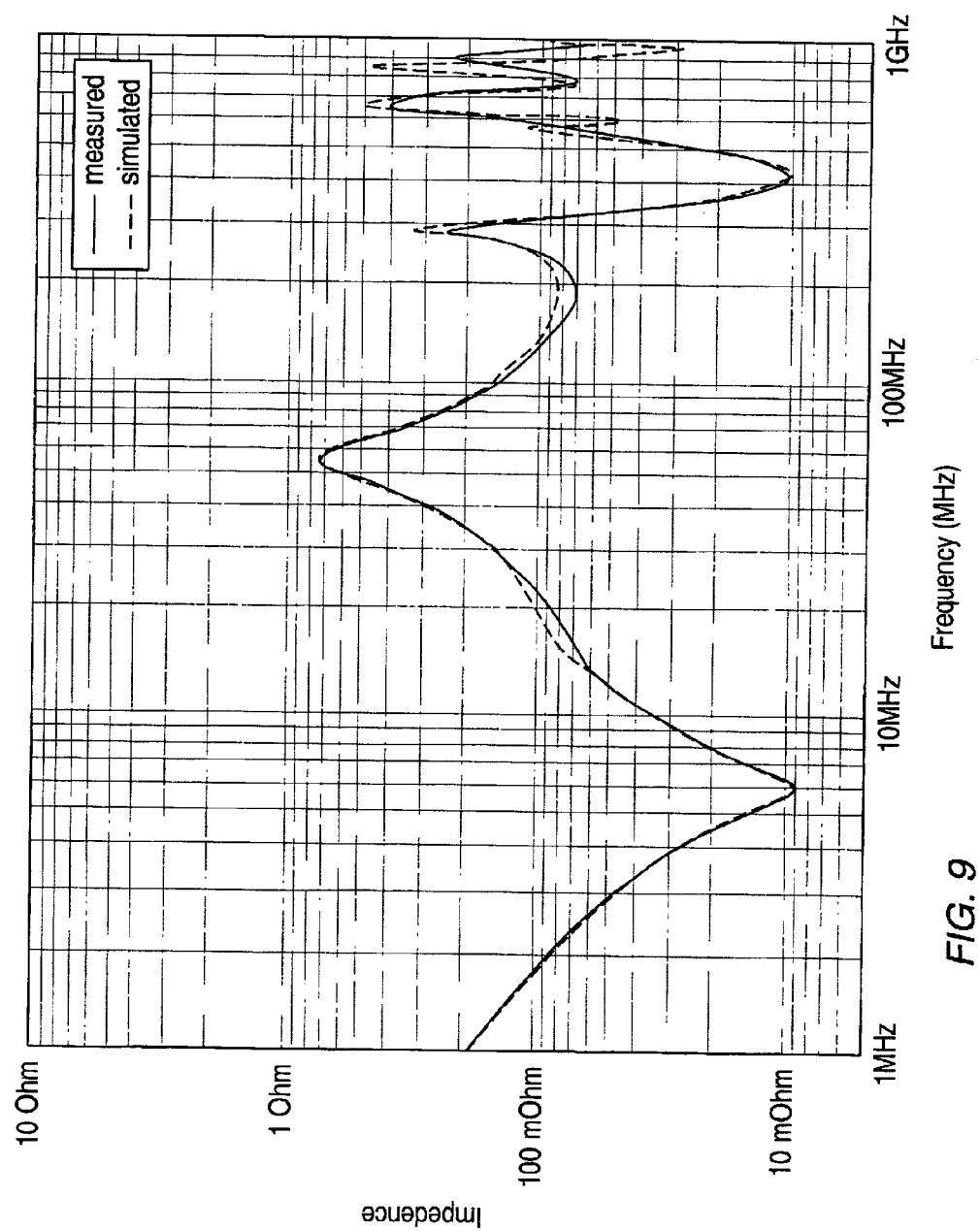
FIG. 9 is a graph of impedance vs. frequency illustrating the correlation between a simulation of one embodiment of the capacitor model and actual measured data.

At the parallel anti-resonant frequency, there is a large peak of current through both the inductors and capacitors. In the simulation from which the graphs were generated, one ampere of current was injected into a simulated PCB having a single capacitor represented by a SPICE model of ladder circuit 505. However, the current at the peak is nearly four amperes through the two inductors labeled $L_{bottom}$ in the circuit shown in FIG. 7. This is because charge is resonating back and forth between the PCB capacitance and the simulated discrete capacitor. As the frequency increases, a higher percentage of the current stays in the lower part of the capacitor, and similarly stays in the lower rungs of the ladder in ladder circuit 500. This is due to the increase in inductive reactance that occurs as frequency increases. As such, current is forced to stay in the lower part of the capacitor, and thus current is no longer evenly distributed among the capacitor plates—the current is now primarily distributed among the lower conductive plates, resulting in the current being forced to go through a higher resistance. This may result in the ESL of the capacitor decreasing as frequency increases, while the ESR of the capacitor increases as frequency increases FIG. 9—Model to Hardware Correlation FIG. 9 is a graph of impedance vs. frequency illustrating the correlation between a simulation of one embodiment of the capacitor model and actual measured data. In the example shown, the measured (i.e. hardware) data is represented by a solid line, whereas the simulated (i.e. model) data is represented by a dashed line. As can be seen in the graph, there is a strong correlation between the measured data and the simulated data. The simulation was conducted using an embodiment of the model shown in FIG. 7. In contrast with the example shown in FIG. 3, there is a very strong correlation between the simulated and measured data, particularly at the first anti-resonant peak. As indicated by the graph, the model very accurately predicts both the frequency and magnitude of the first anti-resonant peak.

Figure 10:
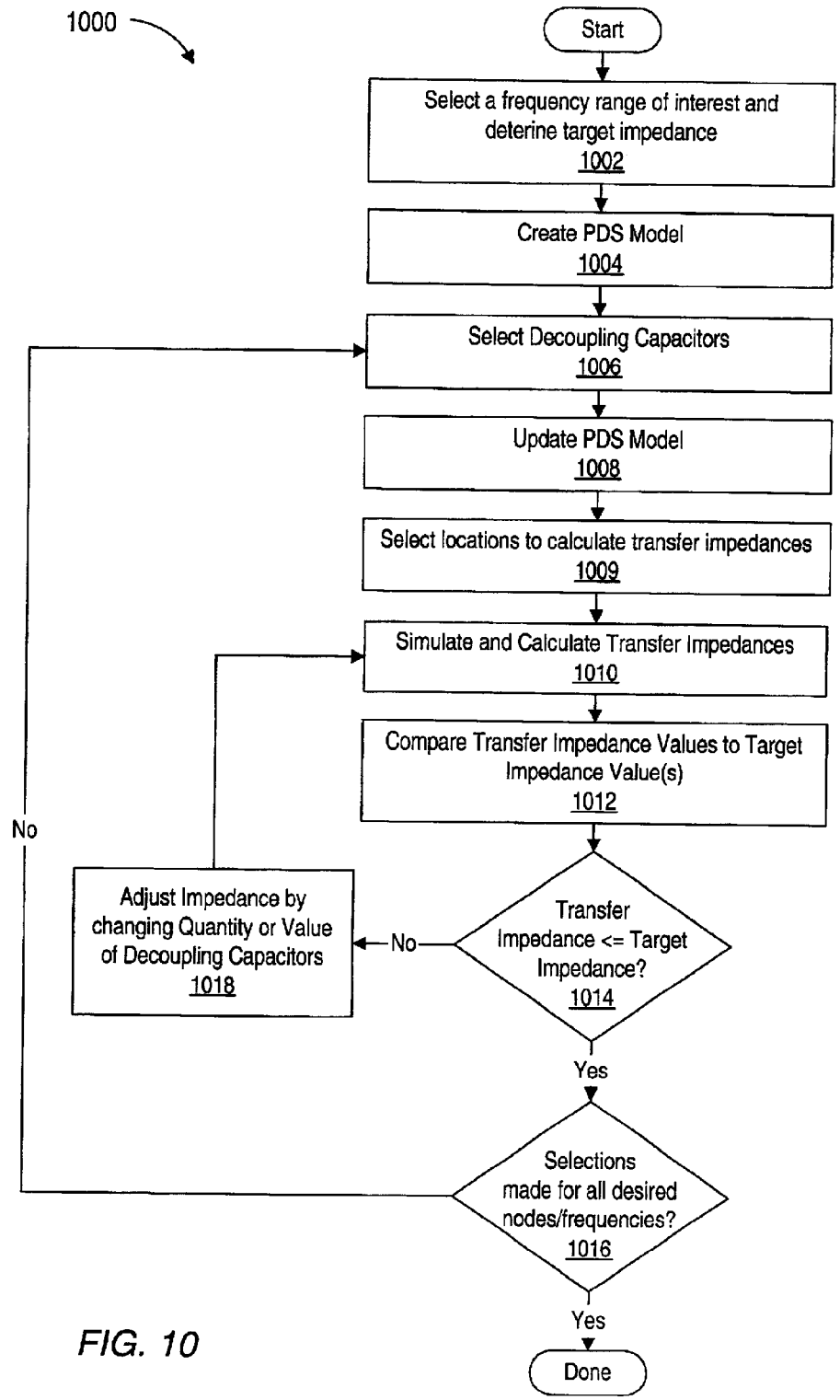
FIG. 10 is a flowchart of one embodiment of a method for determining the required decoupling capacitors for a power distribution system.

FIG. 10—Method for Determining the Required Decoupling Capacitors for a PDS

FIG. 10 is a flowchart of one embodiment of a method for determining the required decoupling capacitors for a power distribution system. Method 1000 begins with selecting a frequency range of interest and determining the target impedance. The frequency range of interest may include clock frequencies and operating frequencies of various components configured to receive power from the power distribution system. The frequency range may also include harmonic frequencies produced during operation of the circuit which receives power from the power distribution system. It may also be important to consider the frequencies at which anti-resonant peaks occur within the power distribution system in order that them may be properly managed.

The determining of the target impedance may include the determining a target impedance that is constant over a wide frequency range, or one that is a function of frequency. In some embodiments of the power distribution system, noise requirements may be very strict over a very wide frequency range, and it may be advantageous to use a constant target impedance. In other embodiments, the target impedance may be allowed to rise above a predetermined frequency, which may allow for fewer capacitors to be used to suppress noise above the predetermined frequency.

Having determined a frequency range of interest and a target impedance for the frequency range of interest, method 1000 may then create a model of the power distribution system (Step 1004). In one embodiment, the model created may be a model such as that discussed above in reference to FIGS. 4 and 5. Other embodiments of a power distribution system model are possible and contemplated. In one embodiment, the model of the power distribution system may be created based on user inputs to circuit simulation software executing on a computer system. The circuit simulation software may be SPICE software or other type of circuit simulation software. In various embodiments, user inputs may include a number of specific details of the power distribution system, such as power requirements, tolerances, transient requirements, physical dimensions of the power distribution system, and so on. In other embodiments, a user may input general requirements of a power distribution system, with the model being created by the circuit simulation software based on these general requirements. In addition to power distribution system specification, the model may also include specifications and parameters of the various electronic circuits configured to receive power from the power distribution system. Such circuits may include processors, ASICs, discrete logic circuits, and various analog circuits. The model may also specifications for discrete components in addition to the decoupling capacitor specifications, and may further include parameters for one or more power supplies.

Following the creation of the power distribution system, the method may then select decoupling capacitors for the power distribution system (Step 1006). In one embodiment, decoupling capacitors may be selected from a database. The database may include information for a number of different capacitors. Such information may include electrical characteristic information, such as capacitance, ESL, ESR, capacitor dimensions and geometry, capacitor construction, and other information. The database may also include various embodiments of circuit models, such as that discussed in reference to FIG. 7, for each of the capacitors in the database.

Selecting the decoupling capacitors may include choosing one or more types of capacitors and a specific quantity of each chosen type. The capacitors may be chosen such that each type of chosen capacitor meets target impedance requirements for a specific frequency or frequency range, and that in combination, all of the chosen capacitors meet the target impedance requirements over the frequency range of interest.

Following the selection of the decoupling capacitors, the model of the power distribution system may be updated (Step 1008). In one embodiment, the power distribution system model may be updated with the capacitor models for each of the selected decoupling capacitors. Updating the model of the power distribution system may also include determining the physical location of the capacitors within the physical implementation of the power distribution system. The physical locations of capacitors in the power distribution system may be selected based on factors such as operating frequencies of various circuit components. For example, decoupling capacitors may be placed near an active component with a high operating frequency in order to bypass any high frequency noise generated by the device. The physical locations of other components in the power distribution system and/or those coupled to the power distribution may be considered as well in order to ensure there is adequate physical space for all components.

Once the power distribution system model has been updated based on the capacitors selected in step 1006, locations may be chosen for calculating transfer impedances (step 1009). In one embodiment, the locations chosen for calculation of transfer impedances may correspond to various nodal points, such as those explained above for the model of FIG. 4. In other embodiments, the locations chosen for calculation of transfer impedances may be chosen based on the physical location of the capacitors in the power distribution system. In various embodiments, the nodal point locations may correspond with the locations of the capacitors in the power distribution system. Other points in the power distribution system may also be chosen as well.

Having selected the locations for calculating transfer impedances, operation of the power distribution system and the electronic circuits which receive power from it may be simulated (Step 1010). Simulation may include simulating normal operation of various electronic circuits including signal transmission and reception and logic switching. Simulation may also include the simulating of transients within the electronic circuits in order to ascertain the response of the power distribution system. During or following the simulation, the transfer impedances may be calculated for the locations chosen in Step 1009. In one embodiment, method 1000 is executed by circuit simulation software on a computer system, and the results of these calculations are sent to an output device such as a monitor or a printer.

Following the calculation of the transfer impedances values, a comparison of the calculated values with predetermined target impedance value(s) may be conducted (Step 1012). This may be conducted for frequencies within the frequency range of interest, and for each of the predetermined locations. If it is determined that a calculated transfer impedance is greater than the target impedance (Step 1014), the impedances may be adjusted (Step 1018) by changing the value or quantity of the selected decoupling capacitors. Step 1018 may also include changing one or more locations of capacitors in the power distribution system. Following Step 1018, the method may then return to the simulation and calculation of transfer impedances performed in Step 1010. If it is determined in Step 1014 that the calculated transfer impedance values were less than or equal to their corresponding target impedance, a determination may then be made as to whether decoupling capacitors have been selected for all nodes and frequencies as necessary to ensure proper operation of the power distribution system (Step 1016). If decoupling is required or desired for additional nodes and/or frequencies, the method may return to the selection process of Step 1006. In one embodiment, circuit simulation software may prompt a user for an indication as to whether it is necessary or desired to return to Step 1006 and select additional decoupling capacitors. This may allow a user of the circuit simulation software to "tweak" the power distribution system design. If it is decided that no further capacitor selections are to be made, the method may then be considered complete.

Figure 11:
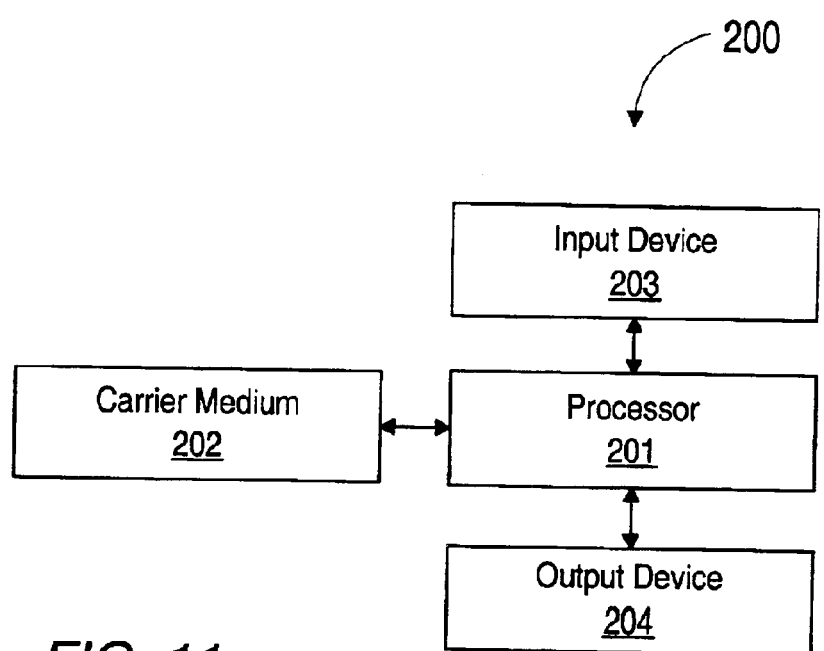
FIG. 11 is a block diagram of one embodiment of a computer system which may be used to implement for determining decoupling capacitors.

FIG. 11—Computer System for Implementing the Method

FIG. 11 is a block diagram of one embodiment of a computer system which may be used to implement a method for determining decoupling capacitors. Computer system 200 may be configured to implement the method of FIG. 10, and may be further configured to implement various other methods utilizing the models of FIGS. 4, 5, and 7. Computer system 200 includes a processor 201 coupled to an input device 203, an output device 204, and a carrier medium 202.

Processor 201 may be a processor configured for executing instructions received from carrier medium 202 or other device. Processor 201 may further be configured to commit results of executed instructions to carrier medium 202 or output device 203. Processor 201 may be any type of processor architecture, such as complex instruction set (CISC) or reduced instruction set (RISC). In some embodiments, computer system 200 may include multiple instances of processor 201. Such embodiments may be configured for parallel processing of various software programs.

Generally speaking, a carrier medium 202 may include storage media (e.g. hard disk storage or floppy disk storage) or memory media such as magnetic or optical media, e.g., disk or CD-ROM (compact disk read only memory), volatile or non-volatile media such as various types of random access memory (RAM) including DRAM, SRAM, SDRAM, RDRAM, read-only memory (ROM), and flash memory. Media may also include flash memory, CD-ROM (compact disc ROM), and DVD-ROM (digital versatile disk ROM). Carrier media may also include transmission media or signals such as electrical, electromagnetic, or digital signals, conveyed via a communication medium such as a network and/or wireless link. Computer system 200 may include multiple instances of carrier medium 202, which may be implemented in the various forms described herein. In one embodiment, carrier medium 200 may be used to store instructions of a circuit simulation software program, such as SPICE. The instructions stored in carrier medium 202 may be executed by processor 201, with the results forwarded back to carrier medium 202, an output device 204, or both.

Input device 203 may be one or more of several different input devices, such as a keyboard, a mouse, a touch-screen monitor, a floppy disk device, and any of the devices listed as carriers above. Results obtained by performing the method using computer system 200 may be forwarded to an output device 204. Output device 204 may be one or more of several different output devices, such as a monitor, a printer, and any of the devices listed above a carriers. It should also be noted that a network interface card may be used in this embodiment as an input device, and output device, or a carrier medium, and further, that computer system 200 may perform various embodiments of the method in conjunction with other computer systems to which it is connected to via a computer network. Thus, in some embodiments, the various methods described herein may be performed by a local computer and one or more remote computers coupled to the local computer.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for determining the required decoupling capacitors for a power distribution system, the method comprising:
   creating a power distribution system model, wherein the model includes a plurality of cells interconnected at predetermined nodes;
   selecting one or more decoupling capacitors for the power distribution system, wherein each of the decoupling capacitors is represented by a capacitor model, wherein the capacitor model is a mathematical model of an electrical circuit, the circuit comprising:
      a first rail circuit and a second rail circuit, the first rail and the second rail circuit comprising a plurality of inductors in a series configuration; and
      a plurality of rung circuits, each rung circuit comprising a resistor and a capacitor in a series configuration, and wherein each rung circuit arranged to electrically connect the first rail circuit and the second rail circuit at distinct nodes;
   updating the power distribution model system based on said selecting;
   simulating operation of the power distribution system using the power distribution system model;
   determining transfer impedance values at each of the predetermined nodes; and
   comparing the transfer impedance values at each of the predetermined nodes to a target impedance.

2. The method as recited in claim 1, wherein the power distribution system model and the capacitor model are implemented in circuit simulation software.

3. The method as recited in claim 2, wherein the power distribution system model and the capacitor model are SPICE models.

4. The method as recited in claim 1, wherein the first rail circuit represents a first post of a capacitor and the second rail circuit represents a second post of the capacitor.

5. The method as recited in claim 4, wherein the capacitor includes a plurality of plates connected to the first post and a plurality of plates connected to the second post, and further includes a dielectric material arranged between each of the plurality of plates.

6. The method as recited in claim 5, wherein the first post and the second post are each configured for soldering to a pad on a printed circuit board.

7. The method as recited in claim 1, wherein each of the plurality of inductors represents a portion of the equivalent series inductance (ESL) of the capacitor.

8. The method as recited in claim 1, wherein the resistor of each of the plurality of rung circuits represents a portion of the equivalent series resistance (ESR) of the capacitor.

9. The method as recited in claim 1, wherein the capacitor of each of the plurality of rung circuits represents a portion of the capacitance of the capacitor.

10. The method as recited in claim 1 further comprising repeating said selecting, said updating, said simulating, said determining and said comparing until the transfer impedance value at each of the predetermined nodes is at or below the target impedance.

11. The method as recited in claim 10 further comprising determining transfer impedances for a plurality of frequencies.

12. The method as recited in claim 11, wherein the target impedance is constant over a frequency range of interest.

13. The method as recited in claim 11, wherein the target impedance is a function of frequency.

14. The method as recited in claim 1, wherein the power distribution system includes a printed circuit board having a power plane and a ground plane, and wherein the electrical characteristics represented by each cell of the power distribution system model include attributes of the printed circuit board.

15. The method as recited in claim 14 wherein each of the cells is modeled by electrical characteristics corresponding to one or more transmission lines and one or more resistors.

16. The method as recited in claim 15, wherein each of the transmission lines is characterized by at least one impedance value and at least one time delay value, and wherein the impedance value and the time delay value are based on physical dimensions of the power distribution system.

17. The method as recited in claim 1, wherein the plurality of cells is arranged in an M×N grid.

18. The method as recited in claim 17, wherein M and N are integers of equal value.

19. The method as recited in claim 1, wherein the power distribution system includes a power supply, and wherein the power distribution system model includes attributes of the power supply.

20. The method as recited in claim 19, wherein the power supply is characterized in the power distribution system model by one or more pole frequencies, one or more zero frequencies, and one or more resistances.

21. A system for determining the required decoupling capacitors for a power distribution system, the system comprising:
   a computer system configured to:
   accept inputs for creating a power distribution system model, wherein the model includes a plurality of cells interconnected at predetermined nodes;
   select one or more decoupling capacitors for the power distribution system, wherein each of the decoupling capacitors is represented by a capacitor model, wherein the capacitor model is a mathematical model of an electrical circuit, the circuit comprising:
      a first rail circuit and a second rail circuit, the first rail and the second rail circuit comprising a plurality of inductors in a series configuration; and
      a plurality of rung circuits, each rung circuit comprising a resistor and a capacitor in a series configuration, and wherein each rung circuit arranged to electrically connect the first rail circuit and the second rail circuit at distinct nodes;
   update the power distribution model system based on said selecting;
   simulate operation of the power distribution system using the power distribution system model;
   determining transfer impedance values at each of the predetermined nodes; and
   compare the transfer impedance values at each of the predetermined nodes to a target impedance.

22. The system as recited in claim 21, wherein the power distribution system model and the capacitor model are implemented in circuit simulation software.

23. The system as recited in claim 22, wherein the power distribution system model and the capacitor model are SPICE models.

24. The system as recited in claim 21, wherein the first rail circuit represents a first post of a capacitor and the second rail circuit represents a second post of the capacitor.

25. The system as recited in claim 24, wherein the capacitor includes a plurality of plates connected to the first post and a plurality of plates connected to the second post, and further includes a dielectric material arranged between each of the plurality of plates.

26. The system as recited in claim 25, wherein the first post and the second post are each configured for soldering to a pad on a printed circuit board.

27. The system as recited in claim 21, wherein each of the plurality of inductors represents a portion of the equivalent series inductance (ESL) of the capacitor.

28. The system as recited in claim 21, wherein the resistor of each of the plurality of rung circuits represents a portion of the equivalent series resistance (ESR) of the capacitor.

29. The system as recited in claim 21, wherein the capacitor of each of the plurality of rung circuits represents a portion of the capacitance of the capacitor.

30. The system as recited in claim 21 further comprising repeating said selecting, said updating, said simulating, said determining and said comparing until the transfer impedance value at each of the predetermined nodes is at or below the target impedance.

31. The system as recited in claim 30 further comprising determining transfer impedances for a plurality of frequencies.

32. The system as recited in claim 31, wherein the target impedance is constant over a frequency range of interest.

33. The system as recited in claim 31, wherein the target impedance is a function of frequency.

34. The system as recited in claim 21, wherein the power distribution system includes a printed circuit board having a power plane and a ground plane, and wherein the electrical characteristics represented by each cell of the power distribution system model include attributes of the printed circuit board.

35. The system as recited in claim 34 wherein each of the cells is modeled by electrical characteristics corresponding to one or more transmission lines and one or more resistors.

36. The system as recited in claim 35, wherein each of the transmission lines is characterized by at least one impedance value and at least one time delay value, and wherein the impedance value and the time delay value are based on physical dimensions of the power distribution system.

37. The system as recited in claim 21, wherein the plurality of cells is arranged in an M×N grid.

38. The system as recited in claim 37, wherein M and N are integers of equal value.

39. The system as recited in claim 21, wherein the power distribution system includes a power supply, and wherein the power distribution system model includes attributes of the power supply.

40. The system as recited in claim 39, wherein the power supply is characterized in the power distribution system model by one or more pole frequencies, one or more zero frequencies, and one or more resistances.

* * * * *